(12) United States Patent
Stevens et al.

(10) Patent No.: US 7,781,016 B2
(45) Date of Patent: Aug. 24, 2010

(54) METHOD FOR MEASURING PRECURSOR AMOUNTS IN BUBBLER SOURCES

(75) Inventors: Ronald Stevens, San Ramon, CA (US); Brendan McDougall, Livermore, CA (US); Jacob W. Smith, Santa Clara, CA (US); Garry Kwong, San Jose, CA (US); Sandeep Nijhawan, Los Altos, CA (US); Lori D. Washington, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 669 days.

(21) Appl. No.: 11/508,375

(22) Filed: Aug. 23, 2006

(65) Prior Publication Data

US 2008/0050510 A1  Feb. 28, 2008

(51) Int. Cl.
*C23C 16/00* (2006.01)

(52) U.S. Cl. ............... 427/248.1; 427/252; 427/255.14; 427/255.23; 427/255.28; 118/688; 118/692; 118/726; 118/715

(58) Field of Classification Search .............. 427/248.1, 427/252, 255.14, 255.23, 255.28; 118/715, 118/726, 692, 688

See application file for complete search history.

(56) References Cited

U.S. PATENT DOCUMENTS

| 6,038,919 | A | 3/2000 | Schmitt et al. |
| 6,216,708 | B1 | 4/2001 | Agarwal |
| 6,365,229 | B1 | 4/2002 | Robbins |
| 7,011,299 | B2* | 3/2006 | Curran ........................ 261/66 |
| 2003/0072875 | A1* | 4/2003 | Sandhu .................... 427/248.1 |
| 2006/0060139 | A1* | 3/2006 | Meneghini et al. .......... 118/715 |
| 2006/0121192 | A1* | 6/2006 | Jurcik et al. ............. 427/248.1 |
| 2006/0141155 | A1 | 6/2006 | Gordon et al. |

* cited by examiner

*Primary Examiner*—Shamim Ahmed
*Assistant Examiner*—Maki A Angadi
(74) *Attorney, Agent, or Firm*—Townsend and Townsend and Crew, LLP

(57) ABSTRACT

Methods are disclosed of determining a fill level of a precursor in a bubbler. The bubbler is fluidicly coupled with a substrate processing chamber through a vapor-delivery system. The bubbler and vapor-delivery system are backfilled with a known dose of a backfill gas. A pressure and temperature of the backfill gas are determined, permitting a total volume for the backfill gas in the bubbler and vapor-delivery system to be determined by application of a gas law. The fill level of the precursor in the bubbler is determined as a difference between (1) a total volume of the bubbler and vapor-delivery system and (2) the determined total volume for the backfill gas.

21 Claims, 5 Drawing Sheets

METHOD FOR MEASURING PRECURSOR AMOUNTS IN BUBBLER SOURCES

BACKGROUND OF THE INVENTION

One of the primary steps in the fabrication of modern semiconductor devices is the formation of a layer or film over a substrate by chemical reaction of gases. Such a deposition process is referred to generally as chemical vapor deposition ("CVD"). Conventional thermal CVD processes supply reactive precursor gases to a heated chamber in which the substrate is disposed. As the precursors pass over the heated substrate, a pyrolytic reaction causes chemical decomposition and produces the solid layer or film.

There are a number of applications in which one or more precursors are provided as liquids or solids, with vapors from such precursors being transported to the chamber with a carrier gas. One difficulty associated with the use of liquid or solid precursors in such arrangements is the need to determine when the precursor in the bubbler has been fully consumed. This is generally difficult because processing arrangements are such that the source is virtually inaccessible. Typically, the precursor is completely contained within a steel container that is itself disposed within a constant-temperature bath. Conventionally, the bubbler is removed from the processing system and weighed to determine the quantity of precursor remaining. But this is undesirable because it involves breaking leaktight seals and exposing the gas lines to air contamination.

A number of alternative techniques have accordingly been used. These include capacitance probing, in which the steel bubbler itself forms one plate of a capacitor. A rod that is inserted into the center of the bubbler acts as the other plate and the liquid or solid precursor acts as the dielectric. Another technique uses ultrasonic detection, in which an ultrasonic transducer is used to bounce sound off the precursor surface to determine its height within the bubbler. Still another technique measures the pressure head associated with the height of the liquid column contained in the bubbler.

Each of these techniques is generally difficult to use with solid precursors, with the last technique not working at all for solid precursors. In addition, the cost of the instruments needed to perform the measurements for each of the techniques with their associated electronics are generally very high. This acts as a barrier to their use even in applications that use liquid precursors.

Other methods that are sometimes used as a surrogate for measurement of the fill level make a direct determination of the precursor vapor in the carrier gas. For instance, this may be done by measuring the speed of sound in the gas mixture since the speed of sound varies with the relative concentration of certain precursors within certain carrier gases. Such techniques use instrumentation that is quite expensive and, while they offer very good control of gas-mixture compositions, they are not directly useful for determining bubbler fill level.

There is a accordingly a general need in the art for methods and systems for measuring precursor amounts in bubbler sources.

BRIEF SUMMARY OF THE INVENTION

Embodiments of the invention provide methods of determining a fill level of a precursor in a bubbler. The bubbler is fluidicly coupled with a substrate processing chamber through a vapor-delivery system. The bubbler and vapor-delivery system are backfilled with a known dose of a backfill gas. A pressure and temperature of the backfill gas are determined. A total volume for the backfill gas in the bubbler and vapor-delivery system are determined from (1) the determined pressure, (2) the determined temperature and, (3) the known dose by application of a gas law. The fill level of the precursor in the bubbler is determined as a difference between (1) a total volume of the bubbler and vapor-delivery system and (2) the determined total volume for the backfill gas. In some instances, the gas law is the ideal gas law.

The total volume of the bubbler and vapor-delivery system may be determined in a similar way. An initial volume of the precursor in the bubbler is determined. The bubbler and vapor-delivery system are backfilled with a known calibration dose of a calibration backfill gas. A calibration pressure and a calibration temperature of the calibration backfill gas are determined. A total volume for the calibration backfill gas is determined from (1) the determined calibration pressure, (2) the determined calibration temperature, and (3) the known calibration dose by application of the gas law. The total volume of the bubbler and vapor-delivery system is determined as a sum of (1) the initial volume of the precursor in the bubbler and (2) the determined total volume for the calibration backfill gas. The initial volume of the precursor in the bubbler may sometimes be calculated from a known mass and known density of the precursor.

In different embodiments, the precursor is maintained as a liquid in the bubbler or is maintained as a solid in the bubbler. The bubbler may sometimes comprise a satellite bubbler fluidicly coupled with a bulk-supply container of precursor. For example, the bubbler may be one of a plurality of bubblers fluidicly coupled with the bulk-supply container of precursor. The backfill gas may be substantially nonreactive with the precursor.

In other embodiments, methods are provided of processing a plurality of substrates with a substrate processing system. The substrate processing system comprises a bubbler, a substrate processing chamber, and a vapor-delivery system fluidicly coupled with the bubbler and with the substrate processing chamber. A total volume of the bubbler and vapor-delivery system is determined. Each substrate is disposed within the substrate processing chamber. Precursor from the bubbler is vaporized and flowed with a carrier gas to the substrate processing chamber to perform a process with the vaporized precursor on the substrate. Thereafter, the fill level of the precursor in the bubbler is determined using one of the methods summarized above.

When the fill level is appropriately low, the bubbler may be replaced in the substrate processing system. In embodiments where the substrate processing system further comprises a bulk-supply container of precursor fluidicly coupled with the bubbler, the fill level of the bubbler may be increased from the bulk-supply container. In some instances, an approximately constant fill level is maintained in the bubbler. The substrate processing system may sometimes comprise a plurality of substrate processing chambers fluidicly coupled with the vapor-delivery system. The bubbler may similarly comprise a plurality of bubblers fluidicly coupled with the bulk-supply container and with the vapor-delivery system. The fill level of precursor in the bubbler may then comprise determining a fill level of precursor in each of the plurality of bubblers. An approximately constant fill level may then be maintained in each of the plurality of bubblers by increasing the fill level of ones of the bubblers from the bulk-supply container.

Methods of the invention may also be used in delivering an accurate dose of precursor to the substrate processing chamber. In such embodiments, a fill level of the precursor in the bubbler is determined as described above. A substrate is disposed within the substrate processing chamber. A known dose of precursor is filled into an isolated volume within the vapor-delivery system from the bubbler. The known dose is then delivered from the isolated volume to the processing chamber using mass flow and pressure to accommodate a predetermined change in volume.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

1. Introduction

Figure 1:
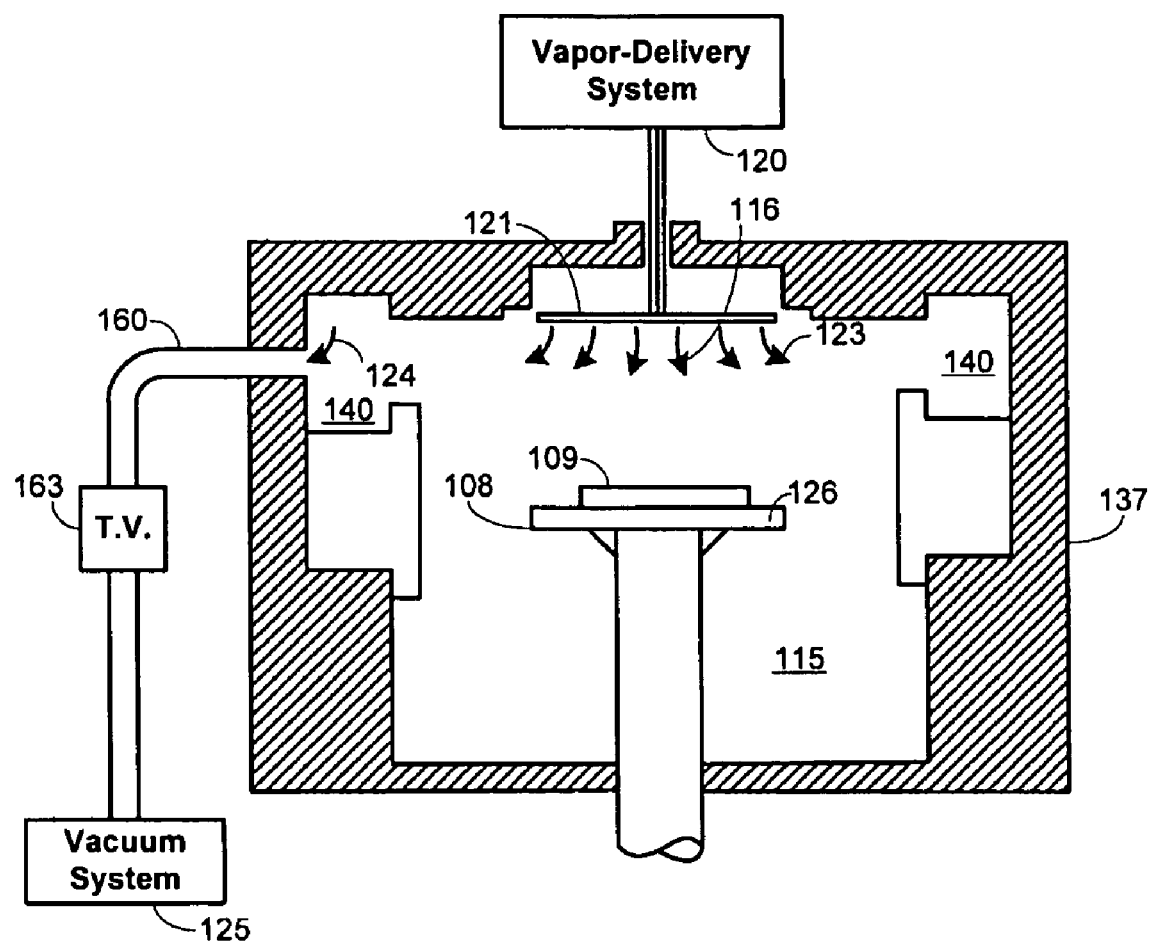
FIG. 1 is a simplified representation of an exemplary CVD apparatus that may be used in implementing certain embodiments of the invention.

The inventors have been involved with the development of techniques to be used in fabrication of group-III nitride optoelectronic devices, such as light-emitting devices ("LEDs"), edge-and surface-emitting lasers, modulators, detectors, and the light. Such compounds are of particular interest because they provide light at relatively short wavelengths, enabling the production of optoelectronic devices that emit in the green, blue, violet, and ultraviolet portions of the spectrum. Devices that emit in the green portion of the spectrum may be a component of white-light devices and shorter-wavelength devices generally permit improvements in the information storage capacity of optical devices like CD-ROMs.

The fabrication of group-III nitride devices provides a good example of processes that use liquid or solid precursors. For example, in the prototypical case of forming a GaN film, one combination of precursors that may be pyrolyzed to yield the Ga and N species is ammonia $NH_3$ and trimethylgallium $(CH_3)_3Ga$ ("TMG"). For growth of other compound semiconductors and alloys, appropriate mixtures of other group-III organometallic and group-V hydride precursors may additionally be blended into the gas stream. For example, AlGaN may be formed by using trimethylaluminum $(CH_3)_3Al$ as an additional precursor and InGaN may be formed by using trimethylindium $(CH_3)_3In$ as an additional precursor. Both of these compounds may be used in forming heterojunctions with GaN to create defects that act as quantum wells used in light emission. Table I provides a summary of certain physical properties of group-III precursors that may be provided as solid or liquid precursors in group-III nitride deposition processes.

TABLE I

Group-III Precursor Properties

| Compound | Melting Point (° C.) | Vapor Pressure at 25° C. (mmHg) |
|---|---|---|
| Gallium Compounds | | |
| Trimethylgallium $(CH_3)_3Ga$ | −15.8 | 228.2 |
| Triethylgallium $(CH_2H_5)_3Ga$ | −82.3 | 6.8 |
| Triisobutylgallium $(C_4H_9)_3Ga$ | | 0.10 |
| Aluminum Compounds | | |
| Trimethylaluminum $(CH_3)_3Al$ | 15.4 | 3.8 |
| Diisobutylaluminum hydride $(C_4H_9)_2AlH$ | −80 | <0.2 |
| Dimethylaluminum hydride $(CH_3)_2AlH$ | 17 | 1.9 |
| Triethylaluminum $(C_2H_5)_3Al$ | −52.5 | 0.02 |
| Triisobutylaluminum $(C_4H_9)_3Al$ | 4 | 0.09 |
| Indium Compounds | | |
| Trimethylindium $(CH_3)_3In$ | 88 | 2.58 |
| Ethyldimethylindium $(CH_3)_2(C_2H_5)In$ | 5.5 | ~3.5 |
| Triethylindium $(C_2H_5)_3In$ | −32 | 0.31 |

Examples of nitrogen precursor liquids include hydrazine $N_2H_4$ or its variants dimethylhydrazine $C_2H_8N_2$, phenylhydrazine $C_6H_8N_2$, butylhydrazine, $C_4H_{12}N_2$, etc. (referred to herein collectively as "hydrazines"). Injection of vapor from such precursors in combination with a flow of ammonia $NH_3$ to the processing chamber may reduce the formation of nitrogen vacancies. In some instances, deposited III-V films may also include dopants. Merely by way of example, one precursor that may be used to provide magnesium dopants is bis(methylcyclopentadienyl)magnesium $(CH_3C_5H_4)_2Mg$, which has a melting point of 29° C. and a vapor pressure at 25° C. of 0.35 mmHg.

While it will be appreciated by those of skill in the art that a variety of gaseous precursors may be used in certain instances, deposition of group-III nitride compounds provides an effective illustration of processes that may use liquid or solid precursors to effective advantage. But it is emphasized that this description of group-III nitride deposition is provided merely for illustrative purposes. There are numerous other applications in which liquid or solid precursors may be used, and the methods and systems of the invention for measuring precursor amounts may readily find application in such other applications.

2. Exemplary Substrate Processing System

FIG. 1 is a simplified diagram of an exemplary chemical vapor deposition ("CVD") system, illustrating the basic structure of a chamber in which individual deposition steps can be performed. This system is suitable for performing thermal, sub-atmospheric CVD ("SACVD") processes, as well as other processes, such as reflow, drive-in, cleaning, etching, deposition, and gettering processes. In some instances multiple-step processes can still be performed within an individual chamber before removal for transfer to another chamber. The major components of the system include, among others, a vacuum chamber 115 that receives process and other gases from a gas or vapor delivery system 120, a vacuum system 125, and a control system (not shown). These and other components are described in more detail below. While the drawing shows the structure of only a single chamber for purposes of illustration, it will be appreciated that multiple chambers with similar structures may be provided as part of a cluster tool, each tailored to perform different aspects of certain overall fabrication processes.

The CVD apparatus includes an enclosure assembly 137 that forms vacuum chamber 115 with a gas reaction area 116. A gas distribution structure 121 disperses reactive gases and other gases, such as purge gases, toward one or more substrates 109 held in position by a substrate support structure 108. Between gas distribution structure 121 and the substrate 109 is gas reaction area 116. Heaters 126 can be controllably moved between different positions to accommodate different deposition processes as well as for an etch or cleaning process. A center board (not shown) includes sensors for providing information on the position of the substrate.

Different structures may be used for heaters 126. For instance, some embodiments of the invention advantageously use a pair of plates in close proximity and disposed on opposite sides of the substrate support structure 108 to provide separate heating sources for the opposite sides of one or more substrates 109. Merely by way of example, the plates may comprise graphite or SiC in certain specific embodiments. In another instance, the heaters 126 include an electrically resistive heating element (not shown) enclosed in a ceramic. The ceramic protects the heating element from potentially corrosive chamber environments and allows the heater to attain temperatures up to about 1200° C. In an exemplary embodiment, all surfaces of heaters 126 exposed to vacuum chamber 115 are made of a ceramic material, such as aluminum oxide ($Al_2O_3$ or alumina) or aluminum nitride. In another embodiment, the heaters 126 comprises lamp heaters. Alternatively, a bare metal filament heating element, constructed of a refractory metal such as tungsten, rhenium, iridium, thorium, or their alloys, may be used to heat the substrate. Such lamp heater arrangements are able to achieve temperatures greater than 1200° C., which may be useful for certain specific applications.

Reactive and carrier gases are supplied from the gas or vapor delivery system 120 through supply lines to the gas distribution structure 121. In some instances, the supply lines may deliver gases into a gas mixing box to mix the gases before delivery to the gas distribution structure. In other instances, the supply lines may deliver gases to the gas distribution structure separately, such as in certain showerhead configurations described below. The gas or vapor delivery system 120 includes a variety of sources and appropriate supply lines to deliver a selected amount of each source to chamber 115 as would be understood by a person of skill in the art. Generally, supply lines for each of the sources include shut-off valves that can be used to automatically or manually shut-off the flow of the gas into its associated line, and mass flow controllers or other types of controllers that measure the flow of gas or liquid through the supply lines. Depending on the process run by the system, some of the sources may actually be liquid or solid sources rather than gases. When liquid sources are used, gas delivery system includes a liquid injection system or other appropriate mechanism (e.g., a bubbler) to vaporize the liquid. Vapor from the liquids is then usually mixed with a carrier gas as would be understood by a person of skill in the art. During deposition processing, gas supplied to the gas distribution structure 121 is vented toward the substrate surface (as indicated by arrows 123), where it may be uniformly distributed radially across the substrate surface in a laminar flow.

Purging gas may be delivered into the vacuum chamber 115 from gas distribution structure 121 and/or from inlet ports or tubes (not shown) through the bottom wall of enclosure assembly 137. Purge gas introduced from the bottom of chamber 115 flows upward from the inlet port past the heater 126 and to an annular pumping channel 140. Vacuum system 125 which includes a vacuum pump (not shown), exhausts the gas (as indicated by arrows 124) through an exhaust line 160. The rate at which exhaust gases and entrained particles are drawn from the annular pumping channel 140 through the exhaust line 160 is controlled by a throttle valve system 163.

The temperature of the walls of deposition chamber 115 and surrounding structures, such as the exhaust passageway, may be further controlled by circulating a heat-exchange liquid through channels (not shown) in the walls of the chamber. The heat-exchange liquid can be used to heat or cool the chamber walls depending on the desired effect. For example, hot liquid may help maintain an even thermal gradient during a thermal deposition process, whereas a cool liquid may be used to remove heat from the system during other processes, or to limit formation of deposition products on the walls of the chamber. Gas distribution manifold 121 also has heat exchanging passages (not shown). Typical heat-exchange fluids water-based ethylene glycol mixtures, oil-based thermal transfer fluids, or similar fluids. This heating, referred to as heating by the "heat exchanger", beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The system controller controls activities and operating parameters of the deposition system. The system controller may include a computer processor and a computer-readable memory coupled to the processor. The processor executes system control software, such as a computer program stored in memory. The processor operates according to system control software (program), which includes computer instructions that dictate the timing, mixture of gases, chamber pressure, chamber temperature, microwave power levels, pedestal position, and other parameters of a particular process. Control of these and other parameters is effected over control lines that communicatively couple the system controller to the heater, throttle valve, and the various valves and mass flow controllers associated with gas delivery system 120.

3. Bubbler Monitoring

Figure 2:
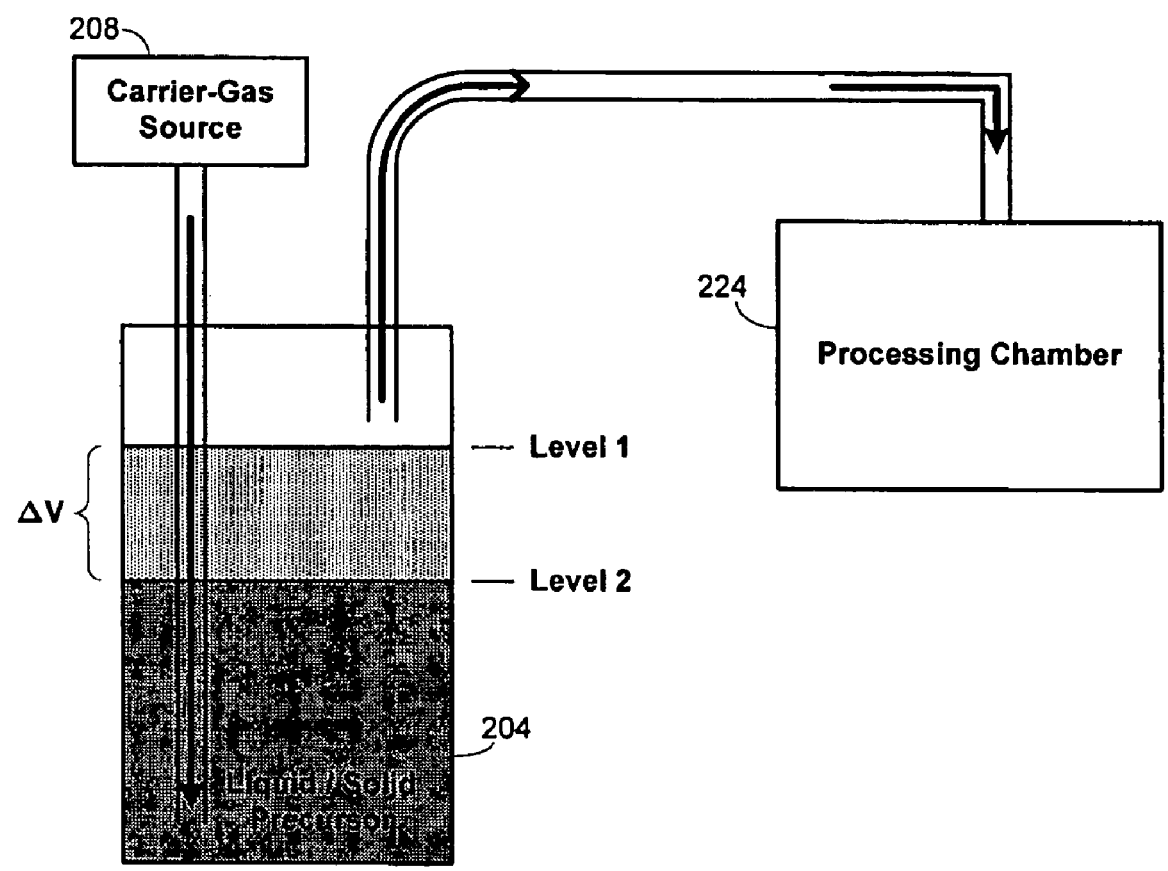
FIG. 2 provides a schematic illustration of a bubbler precursor delivery system.

An illustration is provided in FIG. 2 of a typical bubbler structure that may be used in providing precursor to a processing chamber from a liquid or solid precursor. The illustration provided in FIG. 2 is for a single metalorganic source 204, but it will be understood that such a structure may be replicated one or more times for additional sources so that the gas or vapor delivery system 120 shown in FIG. 1 has access to sufficient sources to implement deposition processes for different materials.

A suitable carrier gas is applied to the precursor 204 from a carrier-gas source 208 to generate a saturated mixture of precursor vapor dissolved in the carrier gas. The carrier gas is commonly molecular hydrogen $H_2$, although a variety of other carrier gases may be used in different embodiments. In the case of nitride deposition, molecular nitrogen $N_2$ or a mixture of $H_2$ and $N_2$ are sometimes used as carrier gases. In various other applications, an inert gas like He, Ne, Ar, or Kr may be use as the carrier gas. The mixture is flowed to the processing chamber 224 where CVD processes may be carried out. The absolute flow of precursor vapor may be metered by controlling the flow of carrier gas, the total pressure in the bubbler, and the temperature of the precursor (which determines the vapor pressure).

As precursor is consumed in performed CVD processes in the processing chamber, the level of precursor 204 within the bubbler may drop, as indicated by relative levels 1 and 2 in the drawing. Embodiments of the invention provide a technique for determining the volume ΔV associated with such a change in precursor level. This technique makes use of the observation that the volume ΔV is not only the volume of the precursor that is consumed, but is also the change in unoccupied volume of the entire precursor delivery system, including the unfilled volume of the bubbler and the volume of vapor lines between the bubbler and the processing chamber 224. Such a total unoccupied volume is determined in embodiments of the invention by application of the ideal gas law to the system.

Figure 3:
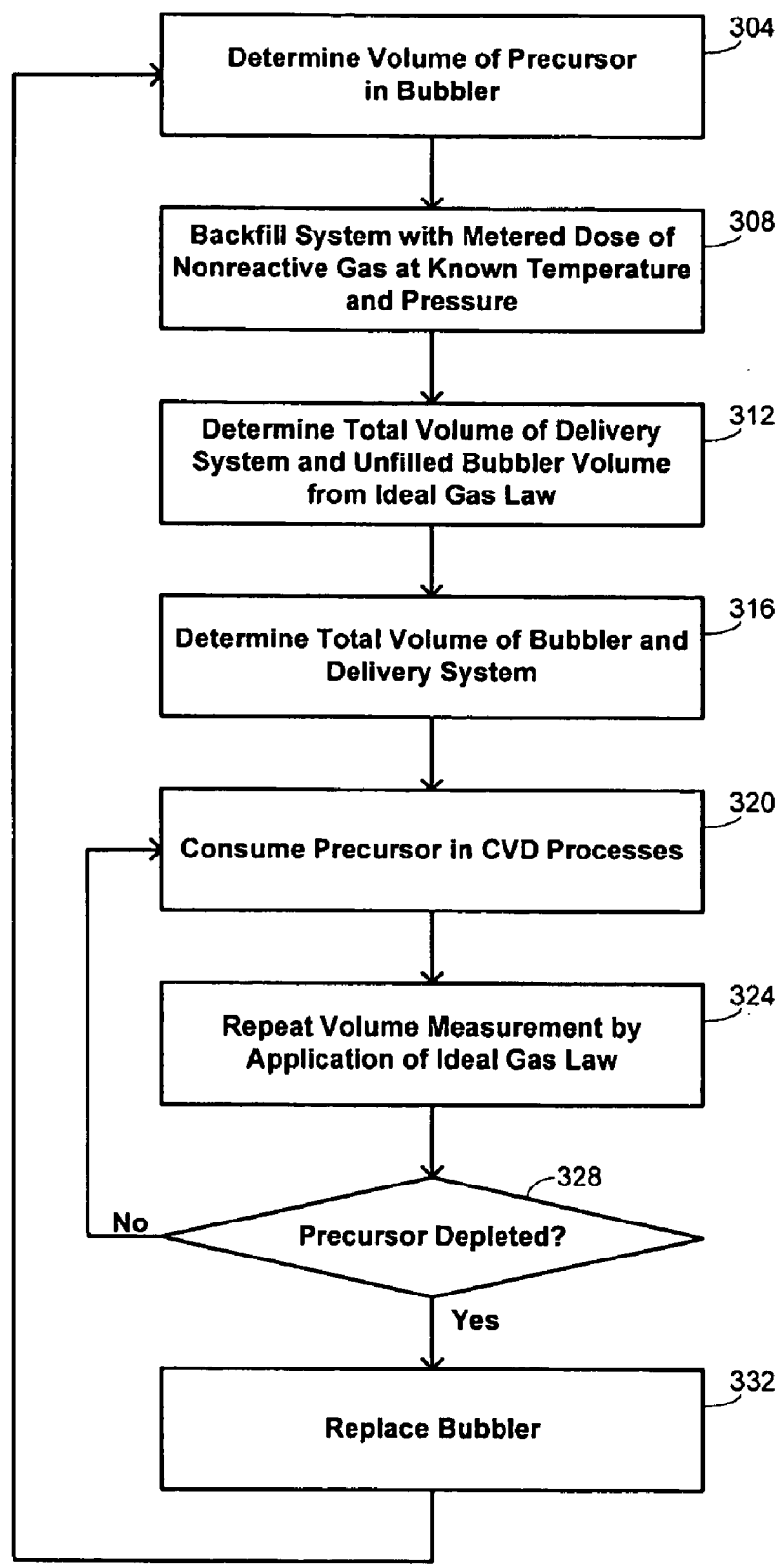
FIG. 3 is a flow diagram that summarizes methods of measuring precursor amounts in accordance with embodiments of the invention.

The method is illustrated for an embodiment in FIG. 3, which provides a flow diagram summarizing a number of steps may be taken in implementing the method. While certain specific steps are shown in the diagram, it is noted that additional steps may sometimes be performed in various alternative embodiments and that some steps may be omitted in certain embodiments. Moreover, although an order for the steps is indicated by the structure of the diagram, this ordering is not necessary and certain steps may be performed in a different order in some embodiments.

The method begins at block 304 by determining a volume of precursor present in a bubbler. This may be determined, for instance, from the fill mass provided by the vendor and the known density of the precursor material. For example, the density of TMG is 1.151 g/cm$^3$; if a vendor supplied a bubbler identifying the fill mass as 87.5 g, the initial precursor volume $V_p^{(0)}$ would readily be calculated to be 76 cm$^3$. This represents the total unoccupied-volume change ΔV in the precursor delivery system, including the unfilled bubbler volume and vapor delivery lines, that will correspond to depletion of the precursor.

The unoccupied volume of the precursor delivery system may be determined from the ideal gas law by backfilling the system with a metered dose nonreactive gas at block 308. In some embodiments, the nonreactive gas is the same as the carrier gas. In certain systems configured for use in nitride deposition with group-III precursors, the nonreactive gas is molecular nitrogen $N_2$. By supplying a metered dose, the number of moles n in the backfill gas is known. The pressure P and temperature T may be measured. From the ideal gas law, PV=nRT, the volume of the system and unfilled portion of the bubbler may be determined as $$V_{sys}^{(0)} = \frac{nRT}{P},$$

where R is the universal gas constant, equal to 62,373 cm$^3$ torr (mol K). The total volume $V_{tot}$ of the bubbler and delivery system may thus be determined at block 316 as the sum $$V_{tot} = V_p^{(0)} + V_{sys}^{(0)}.$$

This total volume remains invariant as precursor is consumed in performing various CVD processes at block 320. Accordingly, when the volume measurement is repeated at block 324 using the ideal gas law to determine $V_{sys}^{(1)}$, the volume of precursor remaining in the bubbler is $$V_p^{(1)} = V_{tot} - V_{sys}^{(1)}$$
$$= V_{sys}^{(0)} + V_p^{(0)} - V_{sys}^{(1)}$$
$$\equiv V_p^{(0)} - \Delta V.$$

Such a later volume determination need not use the same environmental conditions P and T as the initial measurements and may sometimes use a different quantity of backfill gas n. When the change in volume of the system and unfilled bubbler portion ΔV is equal to the initial precursor volume $V_p^{(0)}$, the precursor has been depleted. A check is accordingly made at block 328 after the repeat measurement.

If the precursor has not yet been depleted, CVD processes may continue to be performed at block 320, with a further repeat volume measurement later being performed at block 328 to determine $V_{sys}^{(2)}$, again subject to the constraint that $V_{tot} = V_p^{(2)} + V_{sys}^{(2)}$. It is noted that the determination at block 324 generally provides a value for the volume of precursor remaining (i.e. $V_p^{(1)}$). If an average rate of consumption of precursor volume is known, such as might be determined even roughly over the time t between measurements as ΔV/t, it is possible estimate the remaining lifetime of the bubbler. For instance, with the rough calculation, the remaining lifetime would be $$T = \frac{V_p^{(1)}}{\Delta V} t = \frac{V_p^{(0)} - \Delta V}{\Delta V} t.$$

Once the bubbler has been depleted, it may be replaced with a fresh bubbler at block 332, with the process being repeated to monitor the volume of precursor in the fresh bubbler.

While the illustration above has focused on application of the ideal gas law, it is possible in some embodiments to use a different form of gas law that relates such quantities as pressure, temperature, and quantity of gas to volume. Such alternative gas laws might be known to more accurately reflect the behavior of the particular backfill gas that is used, especially in local pressure-temperature parameter space regions where there are deviations from ideal-gas-law behavior.

Figure 4A:
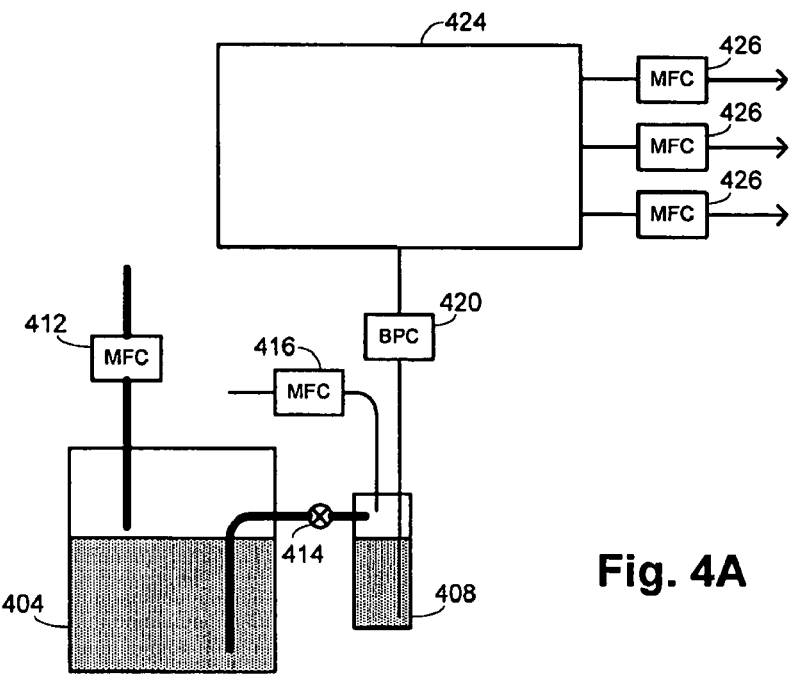
FIGS. 4A and 4B provide illustrations of bulk bubbler precursor delivery systems that may be used for high-throughput depositions.

The techniques illustrated with FIG. 3 may advantageously be applied without modification of the structure of precursor-delivery systems on reactors. While the description of FIG. 3 above has been provided in the context of a conventional single-bubbler delivery system, it will be appreciated by those of skill in the art that the same technique may be used to measure the fill level in bulk delivery systems where bubblers are filled from a larger source. Two types of structures for such bulk delivery systems are shown schematically for purposes of illustration in FIGS. 4A and 4B. Such bulk-delivery systems are typically used for high-throughput deposition processes.

Both types of structures use a large bulk source to supply one or more smaller satellite bubblers, with vapors from the satellite bubblers being metered for use in the deposition chamber. For instance, with the structure of FIG. 4A, precursor from a bulk source 404 is delivered to a single satellite bubbler 408 through a valve 414 by application of carrier gas through a mass-flow controller 412. The satellite bubbler operates in a manner similar to that described above in connection with FIG. 2, with carrier gas being provided through mass-flow controller 416 to provide a flow of a saturated mixture of precursor with the carrier gas to a distribution chamber 424 through back-pressure controller 420. Delivery of metered doses of the mixture to one or more chambers is then effected through respective mass-flow controllers 426.

Figure 4B:
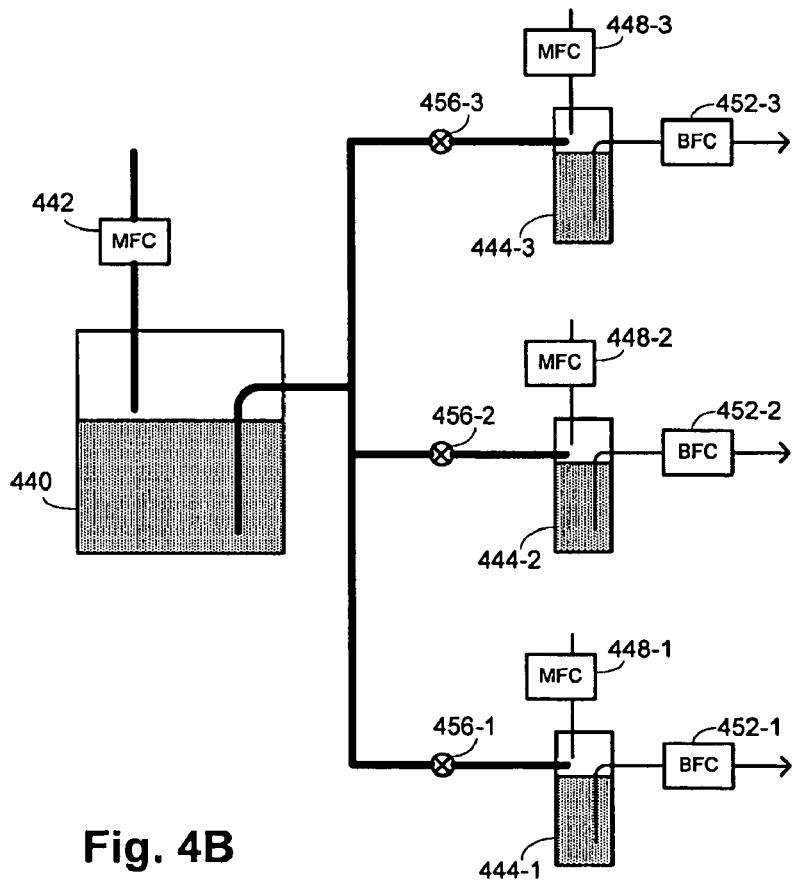

With the structure of FIG. 4B, precursor from a bulk source 440 is delivered to a plurality of satellite bubblers 444 through respective valves 456 by application of carrier gas through a mass-flow controller 442. Each of these satellite bubblers then operates in a manner similar to that described above in connection with FIG. 2. Specifically, carrier gas is provided through a respective mass-flow controller 448 to generate a flow of a saturated mixture of precursor with carrier gas. This mixture is delivered to a respective processing chamber through a respective back-pressure controller 452.

One benefit of such bulk delivery systems is that the bubblers need not be changed as frequently as in a conventional single-bubbler delivery system. Instead, only the bulk-supply container is changed as needed, and the connections between the satellite bubblers and the processing chamber are never disconnected and exposed to air contamination. But to provide reproducible deposition rates, it is generally desirable to maintain a near-constant level of precursor in the satellite bubblers. This may be achieved with the techniques described above for determining the individual bubbler fill levels.

Figure 5:
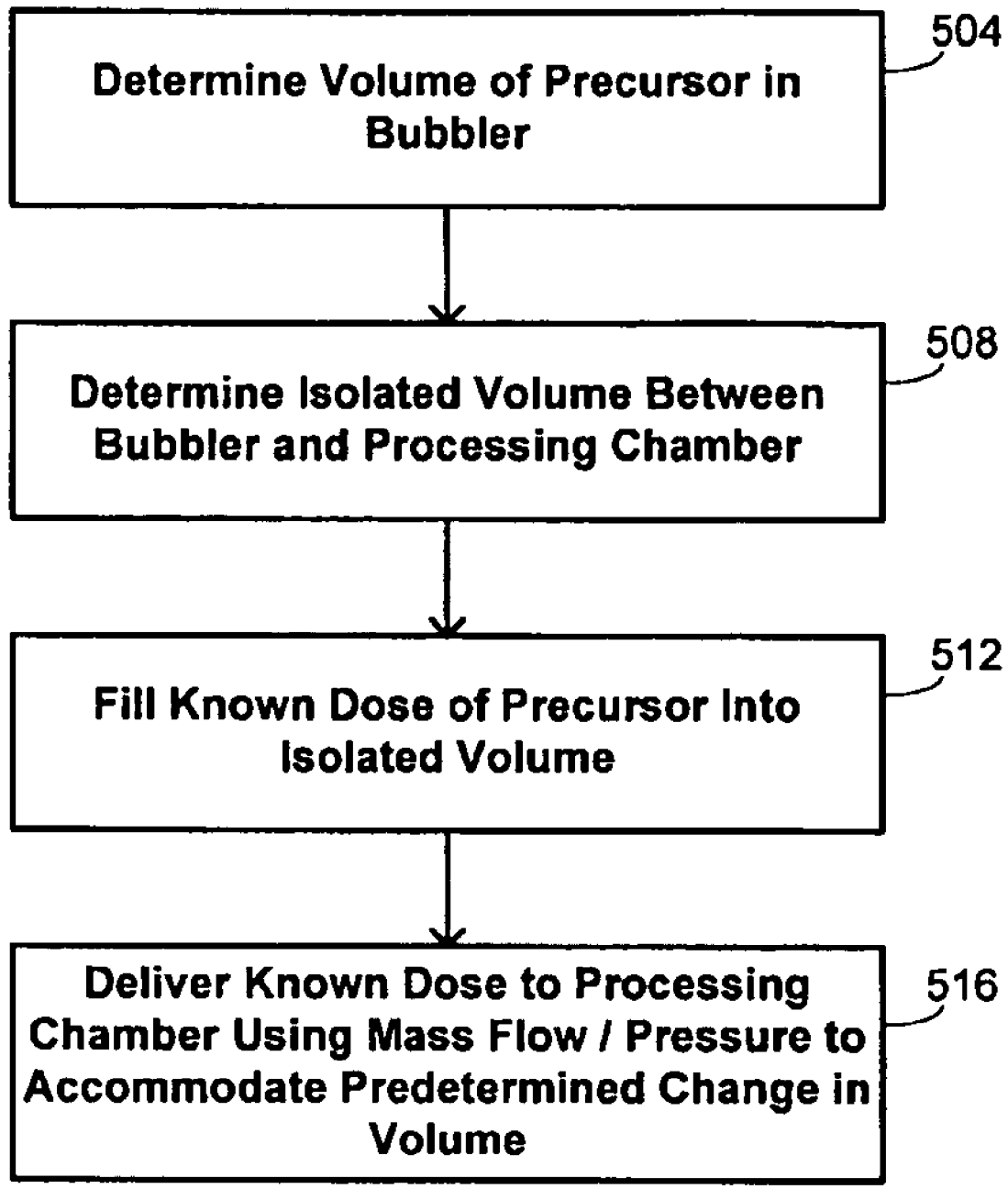
FIG. 5 is a flow diagram that summarizes methods for delivering a known dose of material to a processing chamber.

Still another application of the method is illustrated with the flow diagram of FIG. 5. This flow diagram summarizes methods for delivering a known dose of material from a bubbler to a processing chamber. This may find utility in ALD (referred to in expanded form alternatively as "atomic level deposition" or "alternate layer deposition), a deposition method in which precursors are introduced into a processing chamber in sequential fashion. The first precursor saturates the surface of the substrate with a monolayer of molecules, after which a second precursor is introduced to react with the first precursor and produce a desired monolayer of compound. Typically, an inert gas is introduced between the active precursors to dilute and evacuate the residual precursor in the chamber so that reactions only occur at the substrate surface.

Efficiency of precursor use is a significant concern in such processes because the precursors are generally expensive and the number of alternating layers of film required for device characteristics can be quite high. In typical systems, a bubbler may deliver an inconsistent dose of material since small variations in precursor volume can affect a variety of factors that may influence the overall concentration of precursor in a gaseous makeup. These factors include the precursor exposure to carrier, bubble size, heated surface area of precursor, and the like. By validating a minimum dose required for efficient saturation and subsequently delivering that dose accurately, the cost of manufacturing can be optimized.

Methods for delivering a repeatable dose begin at block 504 by determining a volume of precursor in the bubbler. This may be done as the precursor is consumed using the techniques described in connection with FIG. 3. A known volume is isolated between the bubbler and the processing chamber at block 508. This volume may be isolated using valves within the vapor-distribution system. A known dose of precursor is accordingly filled into the known volume at block 512 and then delivered to the processing chamber at block 516 using mass flow and pressure to accommodate the predetermined change in volume.

It will be appreciated that while a description has been provided of ALD processes, such dosing techniques may be used in other application also.

Having fully described several embodiments of the present invention, many other equivalent or alternative methods of producing the cladding layers of the present invention will be apparent to those of skill in the art. These alternatives and equivalents are intended to be included within the scope of the invention, as defined by the following claims.

What is claimed is:

1. A method of determining a fill level of a precursor in a bubbler fluidicly coupled with a substrate processing chamber through a vapor-delivery system, the method comprising:
    backfilling the bubbler and vapor-delivery system with a known dose of a backfill gas;
    determining a pressure and temperature of the backfill gas;
    determining a total volume for the backfill gas in the bubbler and vapor-delivery system from (1) the determined pressure, (2) the determined temperature, and (3) the known dose by application of a gas law; and
    determining the fill level of the precursor in the bubbler as a difference between (1) a total volume of the bubbler and vapor-delivery system and (2) the determined total volume for the backfill gas.

2. The method recited in claim 1 wherein the gas law is the ideal gas law.

3. The method recited in claim 1 further comprising determining the total volume of the bubbler and the vapor-delivery system, wherein determining the total volume of the bubbler and vapor-delivery system comprises:
    determining an initial volume of the precursor in the bubbler;
    backfilling the bubbler and vapor-delivery system with a known calibration dose of a calibration backfill gas;
    determining a calibration pressure and a calibration temperature of the calibration backfill gas;
    determining a total volume for the calibration backfill gas from (1) the determined calibration pressure, (2) the determined calibration temperature, and (3) the known calibration dose by application of the gas law; and
    determining the total volume of the bubbler and vapor-delivery system as a sum of (1) the initial volume of the precursor in the bubbler and (2) the determined total volume for the calibration backfill gas.

4. The method recited in claim 3 wherein determining the initial volume of the precursor in the bubbler comprises calculating the initial volume of the precursor from a known mass and known density of the precursor.

5. The method recited in claim 1 wherein the precursor is maintained as a liquid in the bubbler.

6. The method recited in claim 1 wherein the precursor is maintained as a solid in the bubbler.

7. The method recited in claim 1 wherein the bubbler comprises a satellite bubbler fluidicly coupled with a bulk-supply container of precursor.

8. The method recited in claim 7 wherein the bubbler is one of a plurality of bubblers fluidicly coupled with the bulk-supply container of precursor.

9. The method recited in claim 1 wherein the backfill gas is substantially nonreactive with the precursor.

10. A method of processing a plurality of substrates with a substrate processing system comprising a bubbler, a substrate processing chamber, and a vapor-delivery system fluidicly coupled with the bubbler and with the substrate processing chamber, the method comprising:
    determining a total volume of the bubbler and vapor-delivery system;
    for each of the plurality of substrates,
        disposing the each of the plurality of substrates within the substrate processing chamber;
        vaporizing precursor from the bubbler; and
        flowing the vaporized precursor with a carrier gas to the substrate processing chamber to perform a process with the vaporized precursor on the each of the plurality of substrates;
    thereafter,
        backfilling the bubbler and vapor-delivery system with a known dose of a backfill gas;
        determining a pressure and temperature of the backfill gas;
        determining a total volume for the backfill gas in the bubbler and vapor-delivery system from (1) the determined pressure, (2) the determined temperature, and (3) the known dose by application of the ideal gas law; and determining a fill level of the precursor in the bubbler as a difference between (1) the determined total volume of the bubbler and vapor-delivery system and (2) the determined total volume for the backfill gas.

11. The method recited in claim 10 wherein determining the total volume of the bubbler and vapor-delivery system comprises:

determining an initial volume of the precursor in the bubbler;

backfilling the bubbler and vapor-delivery system with a known calibration dose of a calibration backfill gas;

determining a calibration pressure and a calibration temperature of the calibration backfill gas;

determining a total volume for the calibration backfill gas from (1) the determined calibration pressure, (2) the determined calibration temperature, and (3) the known calibration dose by application of the gas law; and determining the total volume of the bubbler and vapor-delivery system as a sum of (1) the initial volume of the precursor in the bubbler and (2) the determined total volume for the calibration backfill gas.

12. The method recited in claim 10 wherein the precursor is maintained as a liquid in the bubbler.

13. The method recited in claim 10 wherein the precursor is maintained as a solid in the bubbler.

14. The method recited in claim 10 wherein the backfill gas is substantially nonreactive with the precursor.

15. The method recited in claim 10 further comprising replacing the bubbler in the substrate processing system.

16. The method recited in claim 10 wherein the substrate processing system further comprises a bulk-supply container of precursor fluidicly coupled with the bubbler, the method further comprising increasing the fill level of the bubbler from the bulk-supply container.

17. The method recited in claim 16 further comprising maintaining an approximately constant fill level in the bubbler.

18. The method recited in claim 16 wherein:

the substrate processing chamber comprises a plurality of substrate processing chambers fluidicly coupled with the vapor-delivery system; and the bubbler comprises a plurality of bubblers fluidicly coupled with the bulk-supply container and with the vapor-delivery system;

determining the fill level of the precursor in the bubbler comprising determining a fill level of precursor in each of the plurality of bubblers.

19. The method recited in claim 18 further comprising maintaining an approximately constant fill level in each of the plurality of bubblers by increasing the fill level of ones of the bubblers from the bulk-supply container.

20. A method of processing a substrate with a substrate processing system comprising a bubbler, a substrate processing chamber, and a vapor-delivery system fluidicly coupled with the bubbler and with the substrate processing chamber, the method comprising:

determining a total volume of the bubbler and vapor-delivery system;

backfilling the bubbler and vapor-delivery system with a known dose of a backfill gas;

determining a pressure and temperature of the backfill gas;

determining a total volume for the backfill gas in the bubbler and vapor-delivery system from (1) the determined pressure, (2) the determined temperature, and (3) the known dose by application of the ideal gas law;

determining a fill level of the precursor in the bubbler as a difference between (1) the determined total volume of the bubbler and vapor-delivery system and (2) the determined total volume for the backfill gas;

disposing a substrate within the substrate processing system;

filling a known dose of precursor from the bubbler into an isolated volume within the vapor-delivery system; and delivering the known dose from the isolated volume to the processing chamber using mass flow and pressure to accommodate a predetermined change in volume.

21. The method recited in claim 20 wherein determining the total volume of the bubbler and vapor-delivery system comprises:

determining an initial volume of the precursor in the bubbler;

backfilling the bubbler and vapor-delivery system with a known calibration dose of a calibration backfill gas;

determining a calibration pressure and a calibration temperature of the calibration backfill gas;

determining a total volume for the calibration backfill gas from (1) the determined calibration pressure, (2) the determined calibration temperature, and (3) the known calibration dose by application of the gas law; and determining the total volume of the bubbler and vapor-delivery system as a sum of (1) the initial volume of the precursor in the bubbler and (2) the determined total volume for the calibration backfill gas.

* * * * *